United States Patent [19]
Massie et al.

[11] Patent Number: 5,808,377
[45] Date of Patent: Sep. 15, 1998

[54] POWER SUPPLY CONTENTION PREVENTION CIRCUIT

[75] Inventors: Harold L. Massie, West Linn; Russel K. Hampsten, Beaverton, both of Oreg.

[73] Assignee: Intel Corporation, Santa Clara, Calif.

[21] Appl. No.: 584,106

[22] Filed: Jan. 11, 1996

[51] Int. Cl.[6] ................................ H02J 1/00; G11C 7/00
[52] U.S. Cl. ......................... 307/80; 307/147; 365/226
[58] Field of Search .................... 307/75, 80, 43, 307/147; 365/226, 227, 228, 229; 326/80, 81

[56] References Cited

U.S. PATENT DOCUMENTS

| | | | |
|---|---|---|---|
| 5,436,585 | 7/1995 | DiMarco | 327/333 |
| 5,440,520 | 8/1995 | Schutz et al. | 365/226 |
| 5,521,530 | 5/1996 | Yao et al. | 326/80 |
| 5,550,729 | 8/1996 | Wisell | 363/65 |
| 5,559,966 | 9/1996 | Cho et al. | 395/285 |

*Primary Examiner*—Ronald W. Leja
*Assistant Examiner*—Jonathan S. Kaplan
*Attorney, Agent, or Firm*—Blakely, Sokoloff, Taylor & Zafman

[57] ABSTRACT

Where a computer system PC board has two separate power planes at different voltage levels and a CPU accesses both power planes, a system for detecting when a CPU will short the two power planes and shutting down the power to the lower voltage plane. The contention prevention circuit consists of a voltage level detection circuit having an input connected to the core power plane. The voltage level detection circuit is connected to the input of a shutdown circuit. Upon receipt of a signal from the voltage level detection circuit indicating that the voltage on the core power plane is greater than that provided by the core power supply, the shutdown circuit disables the core power supply.

7 Claims, 2 Drawing Sheets

POWER SUPPLY CONTENTION PREVENTION CIRCUIT

CROSS-REFERENCE TO RELATED APPLICATIONS

Please refer to co-pending application Ser. No. 08/355,027 filed on Dec. 13, 1994, entitled HIGH PRECISION DC-DC CONVERTER, and to co-pending application Ser. No. 08/423,978 filed on Apr. 17, 1995 entitled VOLTAGE REGULATOR DISABLE CIRCUIT, both of which co-pending applications are assigned to the same assignee as the present invention.

BACKGROUND OF THE INVENTION

1. Field of the Invention

The present invention relates to voltage regulator systems for advanced computer system boards. More particularly, it relates to a system for detecting two power supplies that supply two different voltage levels on the same computer system board that are shorted together by inserting an improper component and shutting down one of the power supplies.

2. Description of the Prior Art

As the circuitry for personal computers became more integrated, the majority of the components came to be located on a single printed circuit board—most often referred to as a computer system board or mother board. A typical computer system board provides the primary interconnections for the CPU and other computer system components and the system bus or busses. In addition, the computer system board provides the power to the circuitry in it.

The patent application entitled HIGH PRECISION DC-DC CONVERTER, referenced in the first section hereof, describes a switching regulator circuit that is mounted on the computer system board and that regulates output voltage without a separate oscillator. That is, the voltage regulator which is mounted on the computer system board provides the voltage output required by all circuits on the computer system board.

The patent application entitled VOLTAGE REGULATOR DISABLE CIRCUIT, referenced in the first section hereof, describes a voltage regulator disable circuit for disabling an on-board voltage regulator if there is a CPU upgrade where the new CPU has different power requirements, and the upgrade CPU comes with its own upgrade voltage regulator. The system includes a socket into which an upgrade regulator is plugged. The socket is connected to the original on-board voltage regulator. A disable circuit is coupled to the original on board voltage regulator and the socket and is activated when an upgrade voltage regulator module is plugged into the socket.

Currently each CPU, as well as other components, has one power plane. A power plane is a conductive layer in the CPU integrated circuit that provides operating voltages to the transistors that are the active components of the integrated circuit. More advanced CPU designs will use two power planes in each integrated circuit. One of the power planes will supply power to the core areas of the CPU integrated circuit and the second power plane will supply power to the input/output ("I/O") functions of the CPU. Some of the new dual power plane CPUs will have the same voltage level on both power planes. However, some of the more advanced CPUs will have different voltage on each of the two power planes. For example, the voltage on the I/O power plane will be 3.3 volts and the voltage on the core power plane will be 2.5 volts.

However, all three types of CPUs will have the same pin out and thus fit into the same socket. This creates the problem of insuring that if a single power plane CPU or other component is plugged into a computer system board having support for two, different voltage power planes, the different voltage power supplies are not shorted together and thereby cause failures.

SUMMARY OF THE INVENTION

The present invention is a power supply contention prevention system in a computer system PC board that includes a first power plane in the system PC board. A first power supply is connected to the first power plane and provides power at a first voltage level thereto. A second power plane is also in the system PC board and a second power supply is connected to the second power plane and provides power at a second voltage level thereto. A voltage level detection means having an input electrically connected to the second power plane is provided, and a power supply shut-down circuit is provided which has an input connected to the output of the voltage level detection circuit and an output connected to the second power supply.

BRIEF DESCRIPTION OF THE DRAWING

The preferred embodiment will now be described in conjunction with the drawing in which.

DESCRIPTION OF THE PREFERRED EMBODIMENT

In the following detailed description, many details are described so that a thorough understanding of the invention may be grasped. However, a person of ordinary skill in the art will recognize that the specifics set out are examples and need not necessarily be used to practice the invention. In other instances, well known details have not been shown in detail in order to not obscure the invention.

Figure 1:
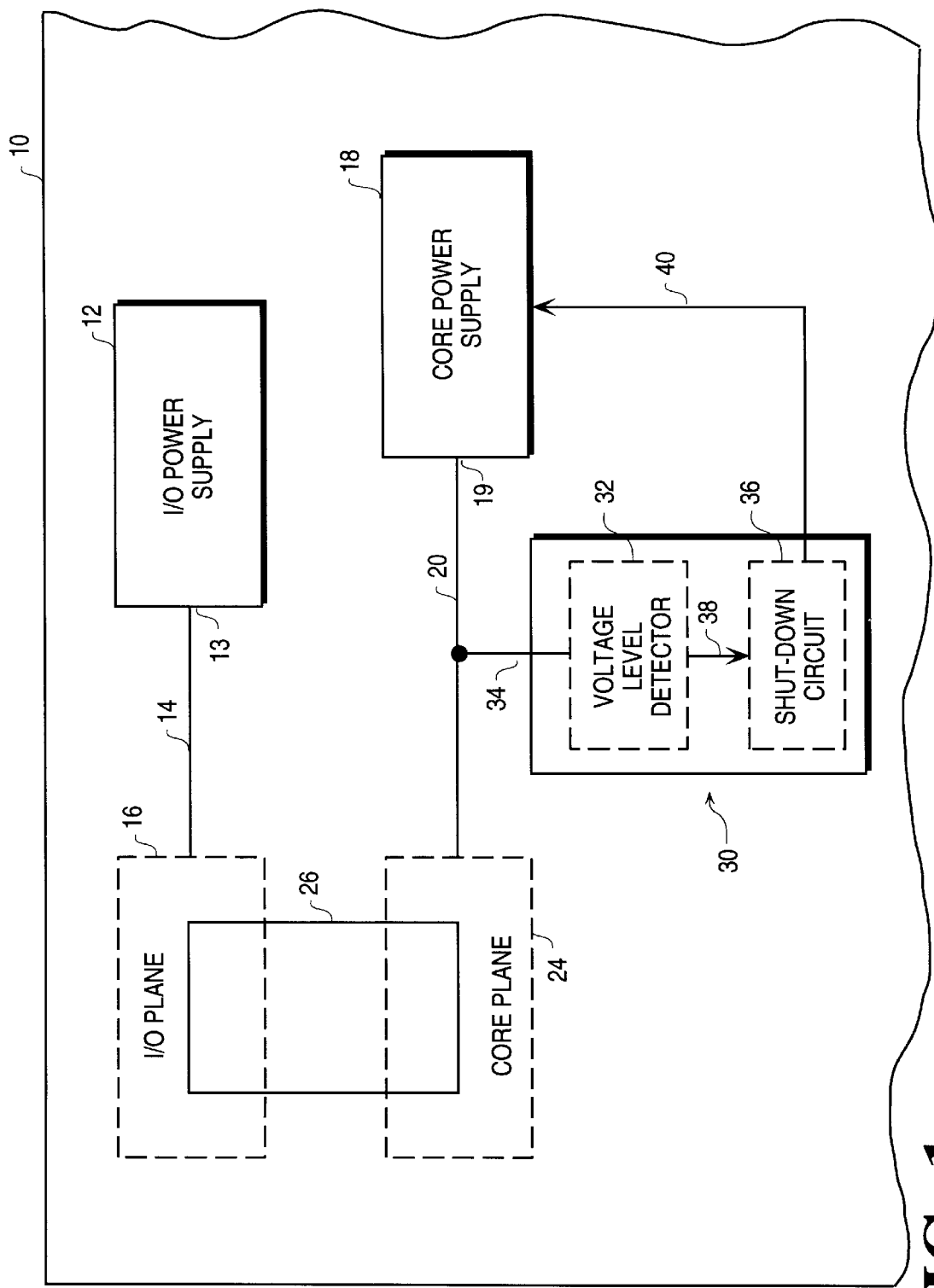
FIG. 1 is a block diagram showing a two-power plane, two-voltage computer system board.

FIG. 1 is a block diagram showing a two-power plane, two-voltage computer system board. Referring now to FIG. 1, a portion of a computer system board 10 is shown. An I/O power supply 12 is mounted to computer system board 10 and has its output connected schematically by lead 14 to an I/O power plane 16 in computer system board 10. I/O power supply 12 may for example supply an output voltage of 3.3 volts. Thus, I/O power plane 16 would be at a voltage level of 3.3 volts.

In like manner, core power supply 18 is mounted to computer system board 10 and has its output 19 connected schematically by lead 20 to core power plane 24. Core power supply 18 may for example supply an output of 2.5 volts. A CPU socket (not shown) is mounted to computer system board 10 such that some of the pins in the CPU socket connect to I/O power plane 16 and some number of the pins connect to core power plane 24. A CPU 26 having a number of pins or connectors is mounted through the socket to the electronic interconnects of computer system board 10 including I/O plane 16 and core plane 24.

The problem to which the present invention is directed presents itself if CPU 26 has only a single power plane and thus shorts I/O power plane 16 to power plane 24 and thereby shorts I/O power supply 12 to core power supply 18.

Contention prevention circuit 30 consists of a voltage level detection circuit 32 having an input 34 connected to the common point between output 19 of core power supply 18 and core power plane 24. Voltage level detection circuit 32 is connected to shut-down circuit 36 as schematically shown by lead 38. Upon receipt of a signal from voltage level detection circuit 32 indicating that the voltage on core power plane 24 is greater than that provided by core power supply 18, shut-down circuit 36 interacts with core power supply 18 so that core power supply 18 is gracefully shut down. This interaction is illustrated in FIG. 1 as lead 40. Thus, contention prevention circuit 30 detects any difference in voltage between core power supply 18 and core power plane 16 and disables core power supply 18 before any damage can be done.

Figure 2:
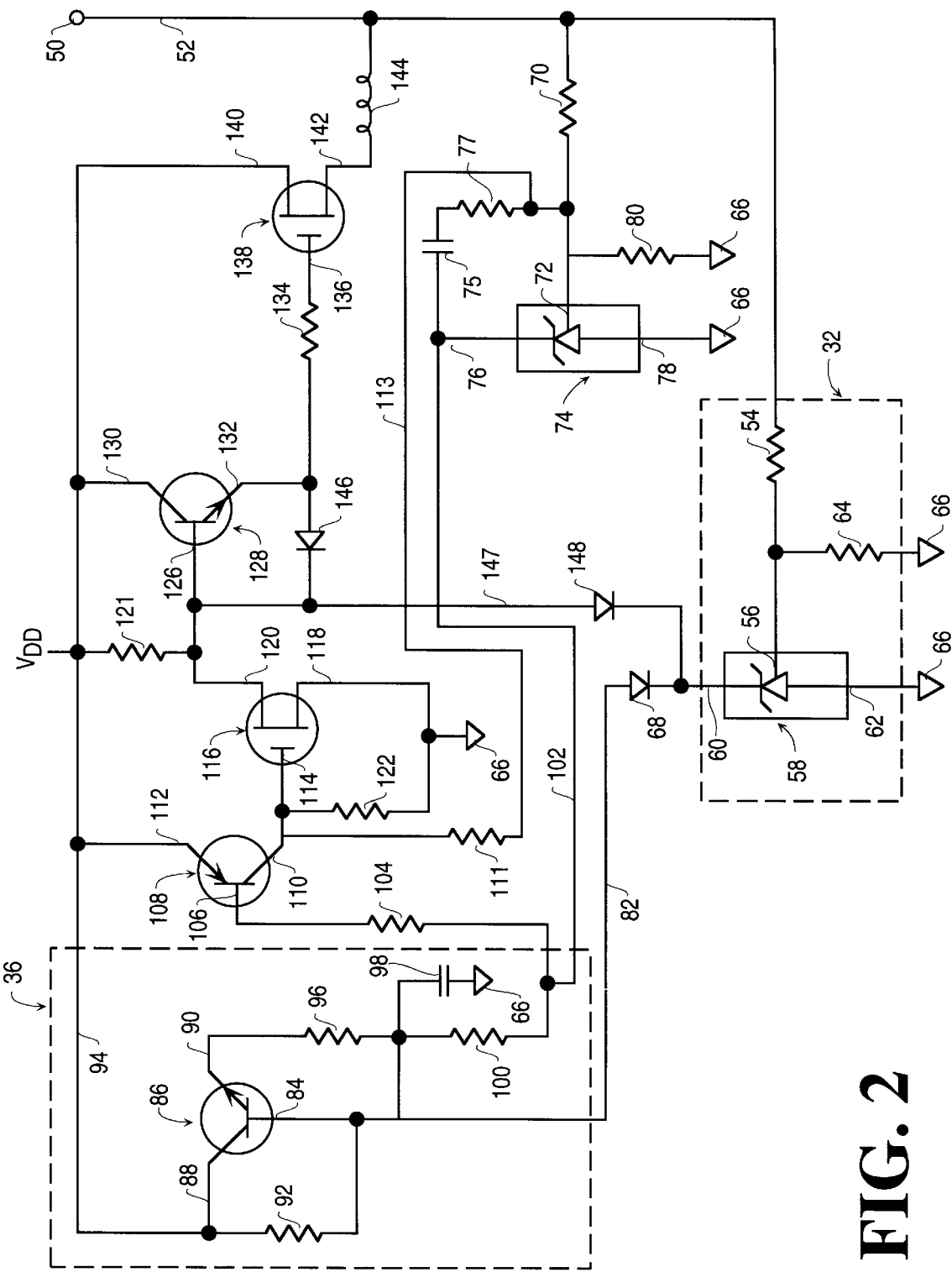
FIG. 2 is a circuit schematic of a specific embodiment of the present invention.

FIG. 2 is a circuit schematic of a specific embodiment of the present invention. Referring now to FIG. 2, point 50 is both the output of the circuit of FIG. 2 and the point at which the voltage of I/O plane 16 is detected. In FIG. 1, point 50 corresponds to input 34 of voltage protection circuit 32 and output 19 of core power supply 18.

Voltage level detector circuit 32 of FIG. 1 comprises reference device 58 and the surrounding passive components and is set off by the dotted line indicated by reference numeral 32. Specifically, point 50 is connected through lead 52 and resistor 54 to a reference input 56 of reference device 58. Reference device 58 also has I/O terminals 60 and 62. Resistor 64 is connected to the common point between resistor 54 and reference input 56 of reference device 58 and ground 66. I/O terminal 60 is connected to diode 68 and I/O terminal 62 is connected to ground 66. Reference device 58 is one of a class of devices which has a very high impedance between its I/O terminals 60 and 62 so long as the voltage on its reference input 56 remains below an internal reference voltage specified by the manufacturer, for example 2.5 volts. When the voltage on reference input 56 exceeds the specified reference voltage, reference device 58 conducts between its I/O terminals 60 and 62 and the voltage drop thereacross is approximately 2 volts. An example of such a device is model TL 431 manufactured by Motorola Corporation.

Shut-down circuit 36 of FIG. 1 comprises NPN bipolar transistor 86 and the surrounding passive components and is set off by the dotted line indicated by reference numeral 32. Specifically, diode 68 is connected via lead 82 to base 84 of NPN bipolar transistor 86. Transistor 86 also has collector 88 and emitter 90. Resistor 92 is connected between collector 88 and base 84. The common point between resistor 92 and collector 88 is connected via lead 94 to voltage source $V_{DD}$. $V_{DD}$ is typically 12 volts dc. Emitter 90 is connected to resistor 96 which is in turn connected through capacitor 98 to ground 66. Resistor 100 connects the common point between resistor 96 and capacitor 98 to I/O terminal 76 of reference device 74 via lead 102.

Transistors 108, 116, 128 and 138 correspond to core power supply 18 in FIG. 1. Specifically, resistor 104 connects the common point between resistor 100 and I/O terminal 76 to base 106 of PNP bipolar transistor 108. Transistor 108 also has collector 110 and emitter 112. Emitter 112 is connected to voltage source $V_{DD}$. Collector 110 is connected by resistor 111 and lead 113 to reference input 72. Collector 110 is also connected to gate 114 of field effect transistor 116. Field effect transistor 116 also has terminals 118 and 120. Gate 114 is connected through resistor 122 to ground 66 and terminal 118 is connected directly to ground. Terminal 120 is connected through resistor 121 to $V_{DD}$. In addition, terminal 120 is connected directly to base 126 of NPN transistor 128. Transistor 128 also has collector 130 and emitter 132. Collector 130 is connected to voltage source $V_{DD}$. Emitter 132 is connected through resistor 134 to gate 136 of field effect transistor 138. Field effect transistor 138 also has terminals 140 and 142. Terminal 140 is connected to voltage source $V_{DD}$. Terminal 142 is connected through inductor 144 to point 50. Diode 146 connects emitter 132 to base 126 of transistor 128. Lead 147 and diode 148 connect base 126 of transistor 128 to I/O terminal 60 of reference device 58.

Point 50 is connected via lead 52 through resistor 70 to reference input 72 of reference device 74. Reference device 74 also has I/O terminals 76 and 78 and is the same device as reference device 58. Capacitor 75 and resistor 77 are connected in series between I/O terminal 76 and reference input 72. Resistor 80 is connected to the common point between resistor 70 and reference input 72 of reference device 58 and ground 66.

In operation generally, when the voltage level on I/O plane 16 of FIG. 1 is the same as the voltage on core plane 24, the circuit of FIG. 2 is in the following state. The voltage at point 50 is sensed by reference device 58. Resistors 54 and 64 form a divider circuit and their values are chosen such that reference device 58 is non-conducting below a specified voltage at point 50 and is conducting above that voltage regardless of the value of the internal reference specified as needed at input 56 by the device manufacturer. Thus, when the voltage at point 50 is 2.5 volts or below, reference device 58 is non-conducting. The voltage at point 50 is also sensed by reference device 74. Again resistors 70 and 80 form a divider circuit and their values are chosen such that when the voltage at point 50 is 2.5 volts or below, reference device 74 is non-conducting.

When reference device 58 is non-conducting, resistor 92 supplies current to base 84 of transistor 86. Since collector 88 and base 84 are approximately at the same voltage, transistor 86 is turned on and conducts. With transistor 86 conducting, substantially all of VDD is passed to resistor 96. Also, since reference device 74 is non-conducting, it is as if I/O terminal 76 is disconnected from resistor 104. Since base 106 and emitter 112 are at approximately the same voltage, transistor 108, which is a PNP, is non-conducting. As a result, no current flows through resistor 104. When transistor 108 is non-conducting, the voltage on gate 114 of field effect transistor 116 is low since it is connected through resistor 122 to ground. With gate 114 low, field effect transistor 116 does not conduct. As a result, the voltage on base 126 of transistor 128 is close to VDD because it is connected through resistor 121 to $V_{DD}$ And collector 130 is at VDD. Thus, transistor 128 is turned on. When transistor 128 is conducting, VDD appears on gate 136 which causes field effect transistor 138 to conduct which in turn supplies power through inductor 144 to point 50. The voltage at point 50 will be regulated to a predetermined voltage by reference device 74.

When the voltage level on I/O plane 16 of FIG. 1 is higher than the voltage on core plane 24, the circuit of FIG. 2 is in the following state. The voltage at point 50 is sensed by reference devices 58 and 74. Since the voltage at reference inputs 56 and 72 is higher than the specified internal reference, both reference devices 58 and 74 conduct. Thus, the voltage on base 84 of transistor 86 is 3 diode drops above ground, which is approximately 2 volts. Since collector 88 is $V_{DD}$ This causes current to flow through resistor 104 and turns on transistor 108. When transistor 108 is on, gate 114 of field effect transistor 116 goes high and transistor 116 is turned on. When transistor 116 is conducting, the voltage on base 126 of transistor 128 is substantially at ground since it is tied through the low impedance of transistor 116. If base 126 of transistor 128 is near ground potential and Collector 130 is at VDD. Transistor 128 is turned off. This puts gate 136 of field effect transistor 138 three diode (diode 146, 148 and 58) above ground potential. At this potential, field effect transistor 138 is non conducting and no power is supplied to point 50 through inductor 144.

Thus, where a computer system board has two separate power planes at different potentials and a CPU accesses both power planes, a system has been shown for detecting when a CPU will short the two power planes and shuts down the power to the lower voltage plane. The preferred embodiment just described is subject to numerous adaptations and modifications without departing from the concept of the invention. Therefore, within the scope of the appended claims, the invention may be practiced other than as specifically described herein.

What is claimed is:

1. An apparatus comprising:

a PC board for interconnecting external components and including first and second power planes for providing power to said external components at a first voltage level and at a second voltage level different than said first voltage level;

a first power supply connected to said first power plane supplying power thereto at said first voltage level and a second power supply connected to said second power plane supplying power thereto at said second voltage level;

a detector circuit monitoring one or more of said voltage levels to determine a shorting condition wherein said power planes are shorted together by one or more of said external components and supplying an output signal indicative of said shorting condition; and a power supply shut-down circuit communicating with said detector circuit and one or more of said power supplies for causing at least one of said power supplies to stop supplying power in response to said detector circuit output signal.

2. The apparatus of claim 1 wherein said second voltage level is lower than said first voltage level and wherein said detector circuit monitors the voltage on said second power plane and said second power supply and supplies an output signal when the voltage on said second power plane is greater than the voltage level provided by said second power supply.

3. The apparatus of claim 2 wherein said detector circuit includes a reference device connected to a common point between said second power plane and said second power supply.

4. A power supply system in a computer system PC board comprising:

a first power plane in said system PC board;

a first power supply connected to said first power plane and providing power at a first voltage level thereto;

a second power plane in said system PC board;

a second power supply connected to said second power plane and providing power at a second voltage level thereto;

a voltage level detection circuit having an input electrically connected to said second power plane and an output, said circuit supplying an indication on said output that the voltage on said second power plane detected by said voltage level detection circuit is greater than the voltage level provided by said second power supply;

a power supply shut-down circuit having an input connected to said output of said voltage level detection circuit and an output connected to said second power supply said power supply shutdown circuit causing said second power supply to stop supplying power to said second power plane in response to said indication of said output of said voltage level detection circuit; and wherein said voltage level detection circuit comprises a reference device having a reference input terminal and first and second I/O terminals, said reference input terminal being connected to said second power plane, and said first I/O terminal being connected to ground, and said second I/O terminal being connected to the input to said shut-down circuit, said reference device having a high impedance between said I/O terminals when the voltage on said reference terminal is below a predetermined voltage and to have a low impedance when said voltage on said reference terminal exceeds said predetermined voltage.

5. A method of preventing contention between first and second power supplies respectively supplying power at first and second voltage levels to first and second power planes located in a single system PC board and supplying power to one or more external components connected to said system PC board, the steps comprising:

monitoring one or more of said voltage levels to determine a shorting condition wherein said power planes are shorted together by one or more of said external components and supplying an indication of said shorting condition; and causing at least one of said power supplies to stop supplying power in response to said indication of said shorting condition.

6. The method of claim 5 wherein said second voltage level is lower than said first voltage level and wherein said monitoring step comprises monitoring the voltage on said second power plane and said second power supply and supplying an indication when the voltage on said second power plane is greater than the voltage level provided by said second power supply.

7. The method of claim 6 wherein the step of monitoring step further includes comparing the voltage at a common point between said second power plane and said second power supply with a reference voltage.

* * * * *